United States Patent [19]
Harwood

[11] Patent Number: 5,965,958
[45] Date of Patent: Oct. 12, 1999

[54] METHOD AND CIRCUIT FOR REDUCING TRANSIENT CURRENTS

[75] Inventor: Michael S. Harwood, Northhampton, United Kingdom

[73] Assignee: Texas Instruments Incorporated, Dallas, Tex.

[21] Appl. No.: 08/394,123

[22] Filed: Feb. 24, 1995

[30] Foreign Application Priority Data

Feb. 25, 1994 [GB] United Kingdom .................... 9403605

[51] Int. Cl.$^6$ .................................................. H01H 47/00
[52] U.S. Cl. ......................... 307/125; 307/130; 307/131; 327/91
[58] Field of Search ..................................... 307/112, 116, 307/125, 130, 131, 113, 109, 110; 327/91, 93, 92, 94, 95, 96

[56] References Cited

U.S. PATENT DOCUMENTS

| | | | |
|---|---|---|---|
| 3,737,754 | 6/1973 | Katz | 307/109 |
| 4,227,186 | 10/1980 | Aschwanden | 341/120 |
| 4,420,784 | 12/1983 | Chen et al. | 361/7 |
| 4,734,879 | 3/1988 | Lin et al. | 364/810 |
| 5,142,435 | 8/1992 | Baumgartner et al. | 361/160 |
| 5,214,313 | 5/1993 | Windes | 307/109 |
| 5,449,960 | 9/1995 | Ohi et al. | 327/94 |
| 5,467,035 | 11/1995 | Ohi et al. | 327/94 |

FOREIGN PATENT DOCUMENTS

| | | |
|---|---|---|
| 938 364 A1 | 2/1971 | Germany . |
| 516 200 A1 | 6/1978 | United Kingdom . |

OTHER PUBLICATIONS

"Sedra and Smith", Microelectronic Circuits, p. 545, 1991.

*Primary Examiner*—Jeffrey Gaffin
*Assistant Examiner*—Jonathan S. Kaplan
*Attorney, Agent, or Firm*—Bret J. Petersen; Richard L. Donaldson

[57] ABSTRACT

A circuit for reducing a potential difference between terminals of an open switch. A current source is arranged to supply charges to a capacitor through first and second switches. Charge is being supplied to the capacitor only when the first switch is closed. The current source and the capacitor are maintained at first and second reference potentials, respectively. The circuit further includes a voltage follower which has its output connected to the second switch and one of its inputs connected to the capacitor and the other input connected to its output. The output of the voltage follower is at the same potential as one terminal of the first switch so that when the second switch is closed, the two terminals of the first switch are at the same potentials as each other.

7 Claims, 1 Drawing Sheet

METHOD AND CIRCUIT FOR REDUCING TRANSIENT CURRENTS

This invention relates to the reduction of the magnitude and duration of transient currents in electrical circuits, especially transient currents that could otherwise occur when a switch in the circuit was closed.

A transient current may be significant, for example, in a circuit by means of which a current source supplies pulses of charge to a charge-storage device. An example of such a circuit is one in which a current source is connected via a switch to a capacitor. If there is a transient current when the switch is closed, the quantity of charge supplied to the capacitor by the current source when the switch is closed for a given period of time, say T, cannot be accurately predicted. Such a transient current will arise if the potential difference between the output from the current source and the input to the capacitor when the switch is open is different from that potential difference in the steady state when the switch is closed, that is to say, following the decay of any such transient current.

An estimate of the quantity of charge supplied to the capacitor can be calculated by ignoring the transient current. Assuming that, in the steady state, the current source provides a constant current I, the quantity of charge Q delivered to the capacitor in a pulse of duration T, is given by IT. Thus, the quantity of charge stored by the capacitor increases linearly throughout the interval during which the switch is closed. The effect of the transient current is that the charge stored on the capacitor increases non-linearly during an initial part of the interval so that the total quantity of charge supplied during the interval will be greater than IT. Further, because the magnitude of the transient current, considered as a function of time, is not precisely known, the true value of Q cannot be predicted.

Clearly, the "error", that is to say the extra charge stored on the capacitor in one pulse of charge as a result of the transient current, becomes more significant for a given transient current as the duration of the interval during which the pulse of charge is transferred becomes shorter.

The present invention provides an electrical circuit, which comprises means for providing a current through a switch having two terminals, the circuit comprising means for eliminating or reducing any potential difference across the switch when the switch is open, and the circuit being such that, when the switch is open, no charge is transferred between the two terminals of the switch.

Advantageously, the means for producing a current is a current source, and the circuit includes charge storage means, to which the current source supplies charge through the switch when the switch is closed.

The means for eliminating or reducing the potential difference across the switch may be a voltage follower connected across the switch. Advantageously, the input voltage of the voltage follower is dependent on the potential on the charge storage means. Preferably, the voltage follower is an operational amplifier that is connected so that it operates as an amplifier with unit gain.

Advantageously, the voltage follower is connected to one terminal of the first-mentioned switch via a second switch, and the second switch is open whenever the first switch is closed.

The invention further provides a phase locked loop comprising a circuit as described above.

The invention still further provides a method of supplying current from a source through a circuit through a switch comprising eliminating or reducing any potential difference across the switch when the switch is open in such a way that no charge is transferred between the two terminals of the switch when the switch is open.

Preferably, the current source is connected to and supplies charge to charge storage means through the switch when the switch is closed.

Preferably, the potential difference across the switch is reduced or eliminated by connecting a voltage follower across the switch.

Preferably, the first switch is opened and closed periodically for intervals so that the current is supplied in pulses.

Preferably, the method is used in a phase locked loop having a voltage controlled oscillator in which the potential of the charge storage means controls the voltage controlled oscillator.

A first and a second circuit according to the invention will now be described, by way of example only, and with reference to the accompanying drawings, of which:

Figure 1:
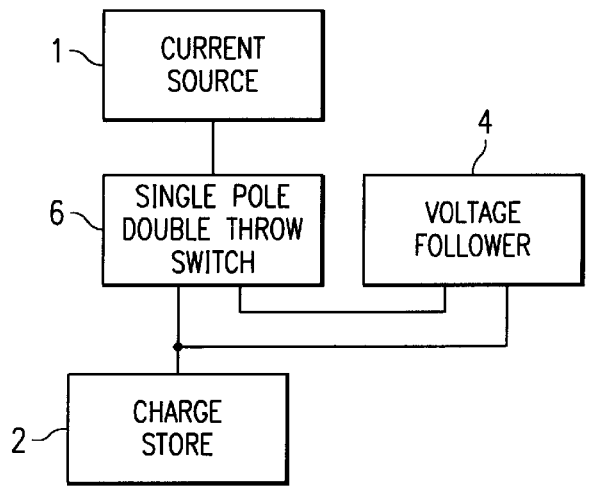
FIG. 1 is a schematic diagram of the first circuit.
Figure 2:
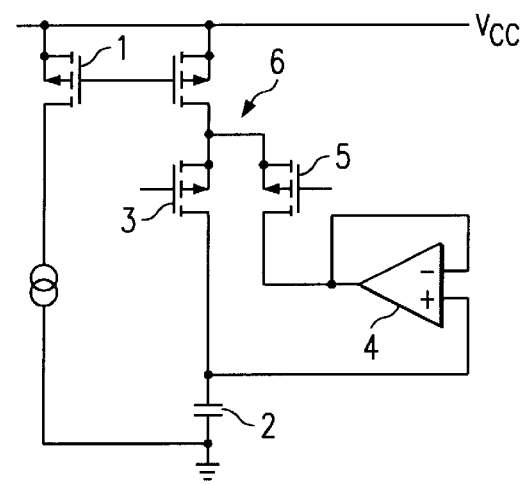
FIG. 2 is a circuit diagram of the first circuit.

Referring to FIGS. 1 and 2 of the accompanying drawings, the first circuit comprises a current source 1 which is arranged to supply charges to a charge-storing device in the form of a capacitor 2. The current source 1 is connected to the capacitor 2 via a first switch in the form of a PMOS transistor 3, charge being supplied to the capacitor 2 only when the first switch is closed. The current source and the capacitor are maintained at first and second reference potentials, respectively.

The circuit also includes an operational amplifier 4, in which the inverting input of the amplifier is connected to the output so that the amplifier operates as a unit-gain amplifier (that is to say, the operational amplifier operates as a voltage follower). The output of the operational amplifier is connected to a second switch in the form of a second PMOS transistor 5 and the operational amplifier and the second switch are connected in series with each other across the first transistor 3 so that the current source is connected to the output of the operational amplifier via the second switch. Thus, the output of the operational amplifer 4 is at the same potential as one terminal of the first switch so that, when the second switch is closed, the two terminals of the first switch are at the same potential as each other.

The drains of the two transistors 3 and 5 are connected together at a node so that together the two transistors constitute a single-pole-double-throw switch, which is indicated generally by the reference numeral 6.

The states of the transistors 3 and 5, and hence the states of the switches, are controlled by input voltage signals applied to the gates of the transistors. The transistors are PMOS, normally off, transistors. For each of the transistors 3 and 5, when the input voltage is sufficiently negative (that is to say when the voltage is "high"), the transistor is conducting so that the associated switch is closed. When the input voltage is below the threshold value for the transistor (that is to say the voltage is "low"), the transistor 3 or 5 is turned off so that the associated switch is open.

In the circuit, the path of the current supplied by the current source is determined by the setting of the two switches. When the first switch is closed and the second switch is open, the current passes through the first switch to the capacitor. When the first switch is open and the second switch is closed, the current passes through the second switch to the output of the operational amplifier. If both switches were closed, a proportion of the current would pass to the capacitor and the remainder would be supplied to the operational amplifier. If both switches were to be open, the voltage of the current source would be a floating voltage.

In use, a binary, periodic square wave voltage input signal is applied to the gate of the first transistor 3. A second input signal, applied to the gate of the second transistor 5 is the inverse of the signal applied to the gate of the first transistor 3. In that way, the first switch is always open when the second switch is closed, (and vice versa). Accordingly, whenever the first switch is open, the second switch is closed, and so the two terminals of the first switch are held at the same potential.

In response to the input signal, the first switch is closed periodically for intervals of a duration corresponding to half the period of the input signal. Thus, pulses of charge are supplied to the capacitor.

Assuming that any internal resistance in the first switch can be neglected, when the first switch is closed, the two terminals of the first switch will be at the same potential as each other. Also by virtue of the voltage follower, the two terminals of the first switch will be at the same potential as each other. Thus, because of the way in which the first and second switches are operated, the closing of the first switch will leave unaltered the difference in potential between the output of the current source 1 and the input to the capacitor 2, so that there will be no transient current.

It is possible to vary the circuit described above so there is a delay between the time when one switch is opened and the time when the other switch is closed. In practice, that means that a small potential difference will develop across the first switch after the second switch opens. However, it is possible so to design the circuit that the delay time is of the order of a few picoseconds.

Figure 3:
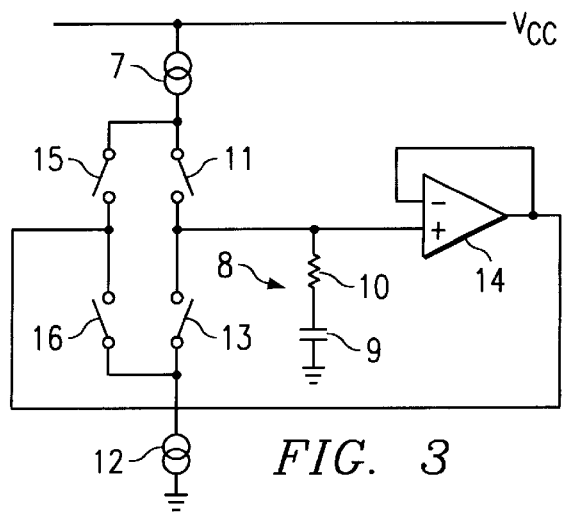
FIG. 3 is a circuit diagram of the second circuit.

Referring to FIG. 3 of the accompanying drawings, the second circuit comprises a first current source 7 which is arranged to supply charges to a charge-storing device 8 in the form of a capacitor 9 and a resistor 10 connected together in series. The current source 7 is connected to the resistor 10 via a first switch 11, charge being supplied to the capacitor 9 only when the first switch 11 is closed.

The first current source 7 is maintained at a first reference potential and the capacitor is connected to a point at a second reference potential.

The circuit includes a second current source 12, which is arranged to remove charges from the charge-storing device 8. The second current source 12 is connected to the resistor 10 via a second switch 13, charge being removed from the capacitor 9 only when the second switch 13 is closed. The second current source 12 is also connected to a point at the second reference potential.

The circuit also includes an operational amplifier 14 so connected that it operates as a unit-gain amplifier. The output of the amplifier 14 is connected to a third switch 15, and the amplifier 14 and third switch 15 in series are connected across the first switch 11 so that the third switch 15 is connected to the current source 7. Thus, when the third switch 15 is closed, the two terminals of the first switch 11 are at the same potential.

Similarly, the output of the operational amplifier 14 is connected to a fourth switch 16. The amplifier 14 and the fourth switch 16 are connected across the second switch 13 so that the fourth switch is connected to the second current source 12. Thus, when the fourth switch is closed the two terminals of the second switch 13 are held at the same potential.

Once again, the path of the current from the current sources through the circuit is determined by the setting of the four switches.

Referring to the first current source 7 and the first and third switches 11, 15, connected to the first current source, when the first switch is open and the third switch is closed, the current from the current source is supplied to the output of the operational amplifier 14. When the first switch 11 is closed and the third switch 15 is open, current is supplied to the capacitor 9. Were both switches 11, 15 to be open, the voltage on the current source would be a floating voltage. If both switches 11, 15 were to be closed only a proportion of the current from the current source would be transferred to the capacitor 9.

Similarly, with reference to the second current source 12, and the second and fourth switches 13, 16 connected to the second current source, when the second switch is open and the fourth switch is closed, current is supplied to the current source from the output of the operational amplifier 14. When the second switch 13 is closed and the fourth switch 16 is open, charge is removed from the capacitor to supply the current to the second current source 12. Were both the second and the fourth switches 13, 16 to be open, the voltage on the current source would be a floating voltage. If the second and fourth switches 13, 16 were closed, only a proportion of the current supplied to the current source would be taken from the capacitor 9.

The circuit is used for supplying and removing charge to and from the capacitor in pulses.

To supply a pulse of charge to the capacitor, firstly the second switch 13 connecting the capacitor 9 to the second current source 12 is open so that no charge is removed from the capacitor. The third switch 15 is closed, to ensure that both terminals of the first switch 11 are at the same potential. Then, the first switch 11 is closed, and the third switch 15 is opened for an interval to connect the first current source 7 to the capacitor to supply a quantity of charge. Because the two terminals of the first switch were at the same potential when the switch was closed, there is a reduction in the transient current that would otherwise occur.

Similarly, a pulse of charge is removed from the capacitor by closing the second switch 13 for an interval. Firstly, the first switch 11 is opened to ensure that no charge is supplied to the capacitor 9 from the first current source 7. Then, the fourth switch 16 is closed to ensure that the two terminals of the second switch 13 are at the same potential. Finally, the second switch 13 is closed, and the fourth switch 16 is opened, for an interval, so that a pulse of charge is removed from the capacitor.

Each of the circuits described above has numerous applications. The circuits could be used, for example, in phase locked loops or other analogue feedback circuits using periodic adjustments of a voltage, where the changing voltage is provided by the charge-storage device.

I claim:

1. An electrical circuit which comprises means for providing a current through a switch having two terminals, the circuit comprising voltage follower means connected across said switch for reducing any potential difference across the switch when the switch is open, and the circuit being such that, when the switch is open, no charge is transferred between the two terminals of the switch, the voltage follower being connected to one terminal of the first-mentioned switch via a second switch, and the second switch is open whenever the first-mentioned switch is closed.

2. A circuit for reducing voltage potential across an open switch to reduce transient currents comprising:

a current source;

a first single-pole double-throw switch having a common terminal and first and second terminals, with the common terminal coupled to the current source;

a capacitor coupled between the first switch terminal and a reference potential;

a circuit portion connected to the first and second terminals of the switch for reducing a voltage difference across the switch first and second terminals when the first switch is operated with the common terminal connected to the first terminal.

3. The circuit of claim 2 wherein the circuit portion is a operational amplifier connected as a voltage follower.

4. The circuit of claim 3 further comprising a second single-pole double-throw switch having a common terminal and first and second terminals, with the common terminal coupled to a second current source and the first and second terminals connected to the first and second terminals of the first single-pole double-throw switch and where the operation of the second single-pole double-throw switch removes charge from the capacitor.

5. The circuit of claim 4 wherein the wherein the capacitor is used to control a voltage controlled oscillator of a phase-locked loop.

6. The circuit of claim 3 wherein the wherein the capacitor is used to control a voltage controlled oscillator of a phase-locked loop.

7. The circuit of claim 2 wherein the capacitor is used to control a voltage controlled oscillator of a phase-locked loop.

* * * * *